United States Patent [19]
Park

[11] Patent Number: 5,888,910
[45] Date of Patent: Mar. 30, 1999

[54] METHOD FOR FORMING INTERLAYER INSULATING FILM OF SEMICONDUCTOR DEVICES

[75] Inventor: Sang Kyun Park, Ichon, Rep. of Korea

[73] Assignee: Hyundai Electronics Industries Co., Ltd., Ichon, Rep. of Korea

[21] Appl. No.: 883,377

[22] Filed: Jun. 26, 1997

[30] Foreign Application Priority Data

Jun. 27, 1996 [KR] Rep. of Korea ............ 9624273

[51] Int. Cl.⁶ .................................. H01L 21/02
[52] U.S. Cl. ............... 438/783; 438/783; 438/760; 438/933
[58] Field of Search ...................... 438/783, 760, 438/933, 784, 902, 763, 624, 632

[56] References Cited

U.S. PATENT DOCUMENTS

| | | | |
|---|---|---|---|
| 5,286,681 | 2/1994 | Maeda et al. ......................... | 438/760 |
| 5,408,569 | 4/1995 | Nishimoto .............................. | 385/132 |
| 5,409,743 | 4/1995 | Bouffard et al. ........................ | 438/784 |
| 5,514,616 | 5/1996 | Rostoker et al. ........................ | 438/723 |
| 5,604,156 | 2/1997 | Chung et al. ........................... | 438/624 |
| 5,646,075 | 7/1997 | Thakur et al. ........................... | 438/760 |
| 5,648,175 | 7/1997 | Russell et al. .......................... | 118/50 |

Primary Examiner—Charles Bowers
Assistant Examiner—Thanh Nguyen
Attorney, Agent, or Firm—Thelen Reid & Priest LLP

[57] ABSTRACT

A method for forming an interlayer insulating film, which involves a first oxide film deposition, a GeBPSG film deposition, a thermal treatment and a second oxide film deposition all being carried out in a continuous manner in an LPCVD device. In accordance with this method, it is possible to form an interlayer insulating film having a superior planarization characteristic in a single pass. The deposition and thermal treatment of the interlayer insulating film are carried out in a continuous manner in a single processing device. Accordingly, it is possible to effectively suppress the degradation of the GeBPSG film caused by a moisture absorption. Since a protective oxide film is deposited over the GeBPSG film in a continuous manner after the thermal treatment of the GeBPSG film, the degradation of the GeBPSG film caused by the moisture absorption can be affectively suppressed.

2 Claims, 3 Drawing Sheets

| sequential steps | loading a semicondutor substrate | stabilization process | first oxide film | GeBPSG film depostion | thermally treating | second oxide film | unloading a semiconductor substrate |
|---|---|---|---|---|---|---|---|
| teacting gas | $N_2$ | $N_2$ | $TEOS+O_2$ | $TEOS+TEB+TEOG$ $+O_2+PH_3$ | $O_2,N_2$ $H_2+O_2$ | $TEOS+O_2$ | $N_2$ |
| temperlature | | | 600 ~ 800°C | | | | |
| pressure | | | 1 mtorr ~ 100 torr | | | | |

| sequential steps | loading a semiconductor substrate | stabilization process | first oxide film | GeBPSG film deposition | thermally treating | second oxide film | unloading a semiconductor substrate |
|---|---|---|---|---|---|---|---|
| reacting gas | $N_2$ | $N_2$ | $TEOS+O_2$ | $TEOS+TEB+TEOG$ $+O_2+PH_3$ | $O_2, N_2$ $H_2+O_2$ | $TEOS+O_2$ | $N_2$ |
| temperature | 600 ~ 800°C | | | | | | |
| pressure | 1 mtorr ~ 100 torr | | | | | | |

Fig. 2

# METHOD FOR FORMING INTERLAYER INSULATING FILM OF SEMICONDUCTOR DEVICES

BACKGROUND OF THE INVENTION

1. Field of the Invention

The present invention relates to a method for forming an interlayer insulating film of a semiconductor device, and more particularly, to a method for forming an interlayer insulating film of a semiconductor device, in which a first oxide film, a Ge boro phospho silicate glass (GeBPSG) film and a second oxide film are sequentially formed over a semiconductor substrate having a topology using a low pressure chemical vapor deposition process, to form the interlayer insulating film.

2. Description of the Prior Art

As semiconductor devices have an increased integration degree, their surface irregularity increases. That is, the topology of such semiconductor devices increases. For this reason, planarization techniques for planarizing a surface having a high topology using an insulating film have been highlighted as an important technique used in the fabrication of highly integrated semiconductor devices. Generally, a BPSG film added with boron (B) and phosphor (P) in a high concentration is used to planarize a surface having a high topology. For the planarization, the BPSG film is thermally treated at a high temperature.

However, the addition of impurities in a high concentration involved in the planarization using the BPSG film results in a degradation in film stability and a formation of crystal defects ($BPO_4$). Furthermore, the thermal treatment at a high temperature results in a damage of shallow junctions. As a result, there is a limitation on the planarization.

Another planarization method has also been proposed which involves the steps of depositing a GeBPSG film added with Ge as another impurity at a temperature of 350° to 450° C. in accordance with an atmospheric pressure chemical vapor deposition (APCVD) process, and thermally treating the GeBPSG film at a temperature of 750° to 850° C. The addition of Ge results in a formation of $GeO_2$ which serves to lower the viscous flow temperature of the BPSG film. Accordingly, it is possible to achieve a planarization using the thermal treatment at a temperature of 750° to 850° C.

FIG. 1 is a sectional view illustrating a conventional method for forming an interlayer insulating film.

In accordance with this method, a patterned conductive layer 2, which is to be used as a bit line or word line, is formed on a semiconductor substrate 1. An oxide film 3 is then deposited over the entire exposed surface of the resulting structure in order to prevent moisture and impurities from penetrating into the layer disposed beneath the oxide film when a subsequent process is carried out. In order to planarize the resulting structure, a GeBPSG film 4 is deposited as a planarizing insulating film over the oxide film 3 at a temperature of 350 ° to 450° C. The GeBPSG film 4 is then thermally treated at a temperature 750° to 850° C. so that it has a planarized surface.

Where the GeBPSG film 4 deposited at a temperature of 350° to 450° C. is thermally treated at a temperature of 750° to 850° C., as mentioned above, crystal defects ($BPO_4$) are formed at regions (a) and (c) shown in FIG. 1. As a result, the GeBPSG film 4 has protruded surface portions at the regions (a) and (c). The GeBPSG film 4 is also damaged at a region (b) due to its moisture absorption. As a result, the oxide film 3 is exposed at the region (b).

Since the GeBPSG film exhibits a weakness against moisture and has a porous film structure, it reacts easily with moisture existing in the atmosphere even in a short period after its deposition and before its thermal treatment. As a result, hazes and acid oxide defects are produced. Furthermore, the GeBPSG film may be partially lost, thereby exposing the under layer.

Even after the thermal treatment at a temperature of 750° to 850° C., the moisture absorption property of the GeBPSG film is not improved. Rather, crystal defects ($BPO_4$) are formed while the thermally-treated GeBPSG film is cooled. Such crystal defects result in a short circuit of a wiring which is subsequently formed. Due to such a degradation, it is impossible to use the conventional method practically.

SUMMARY OF THE INVENTION

An object of the invention is to solve the above-mentioned problems and to provide a method for forming an interlayer insulating film of a semiconductor device, which involves the steps of depositing a first oxide film over a substrate having a topology, depositing a GeBPSG film over the first oxide film at a temperature of 600° to 850° C., carrying out a thermal treatment to achieve a planarization for the GeBPSG film, depositing a second oxide film over the planarized GeBPSG film while processing the above processing steps without losing a vacuum.

In accordance with the present invention, this object is accomplished by providing q method for forming an interlayer insulating film of a semiconductor device, comprising the steps of: forming a first oxide film over a substrate having a topology; forming a Ge boro phospho silicate glass film over the first oxide film; planarizing the Ge boro phospho silicate glass film using a thermal treatment process without losing a vacuum; forming a second oxide film over the Ge boro phospho silicate glass film without losing a vacuum.

BRIEF DESCRIPTION OF THE DRAWINGS

Other objects and aspects of the invention will become apparent from the following description of embodiments with reference to the accompanying drawings in which:

FIG. 2 is a table illustrating steps and conditions of a method for forming an interlayer insulating film of a semiconductor device in accordance with the present invention.

DETAILED DESCRIPTION OF THE PREFERRED EMBODIMENTS

FIG. 2 illustrates sequential steps and conditions of a method for forming an interlayer insulating film of a semiconductor device, which has a multilayer structure comprised of a first oxide film, a GeBPSG film and a second oxide film and has a planarized surface, in accordance with the present invention.

As shown in FIG. 2, the method of the present invention involves a first step of loading a semiconductor substrate in an LPCVD device maintained at a temperature of 600° to 850° C. and a pressure of 1 mTorr to 100 Torr, a second step of carrying out a stabilization process, a third step of forming an undoped, first oxide film ($SiO_2$) in an atmosphere containing tetra ethyl ortho silicate (TEOS) and $O_2$, a fourth step of depositing a GeBPSG film using a reacting gas consisting of TEOS, tri ethyl boride (TEB), tri ethyl ortho germanium (TEOG), $O_2$ and $PH_3$, a fifth step of thermally treating the GeBPSG film in an atmosphere of $O_2$, $N_2$ or $H_2+O_2$ without losing the vacuum, thereby planarizing the GeBPSG film, a sixth step of forming an undoped, second oxide film in an atmosphere containing TEOS and $O_2$ without losing the vacuum, and a seventh step of unloading the resulting semiconductor substrate from the LPCVD device.

Figure 1:
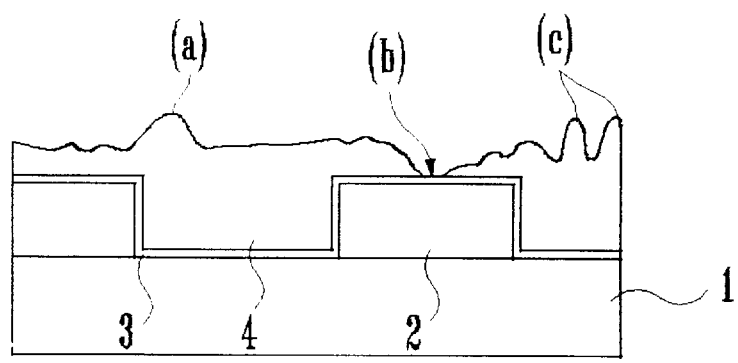
FIG. 1 is a sectional view illustrating a conventional method for forming an interlayer insulating film.
Figure 3:
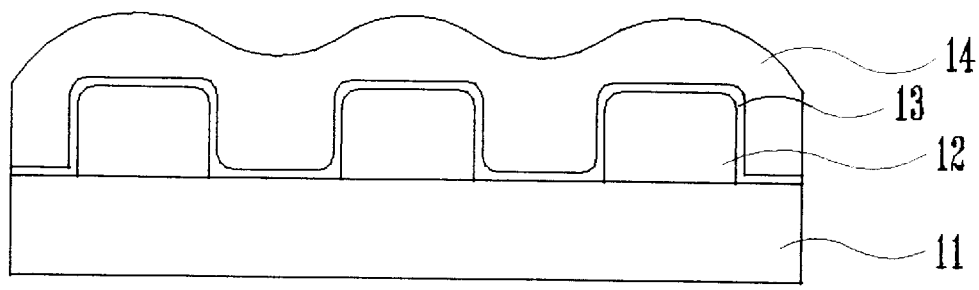
FIGS. 3 and 4 are sectional views respectively illustrating sequential steps of the interlayer insulating film forming method according to the present invention.
Figure 4:
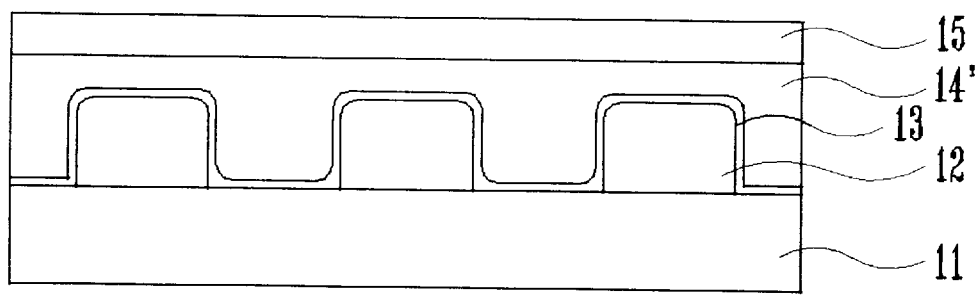

FIGS. 3 and 4 are sectional views respectively illustrating sequential steps of the interlayer insulating film forming method according to the present invention.

Referring to FIG. 3, a semiconductor substrate 11 is shown. A patterned conductive layer 12, which is to be used as a word line or bit line, is formed on the semiconductor substrate 11. A first oxide film 13 is deposited to a thickness of 100 to 2,000 Å over the resulting structure in accordance with an LPCVD process using a reacting gas containing $SiH_4$, TEOS, $O_2$ and $N_2O$. The first oxide film 13 serves to prevent impurities, such as Ge, B or P, from penetrating into the layer disposed beneath the first oxide film. A GeBPSG film 14 is deposited as a planarizing film over the first oxide film 13 in accordance with the LPCVD process. The deposition of the GeBPSG film 14 is carried out at a temperature of 600° to 850° C. Accordingly, the GeBPSG film 14 flows simultaneously with its deposition. As a result, the GeBPSG film 14 is more or less planarized. This GeBPSG film 14 is deposited to a thickness of 1,000 to 10,000 Å under the condition in which the content of Ge is 30 wt % or less, the content of B ranges from 1 wt % to 10 wt %, and the content of P ranges 1 wt % to 10 wt %.

Referring to FIG. 4, a planarized GeBPSG film 14' is shown which is formed over the resulting structure of FIG. 3. The formation of the GeBPSG film 14' is carried out by thermally treating the GeBPSG film 14 in an atmosphere of $O_2$, $N_2$, $N_2O$ or a mixture of $H_2$ and $O_2$ for a desired period. A second oxide film 15 is deposited to a thickness of 100 to 2,000 Å over the GeBPSG film 14' in an atmosphere containing $SiH_4$, TEOS, $O_2$ and $N_2O$ without losing the vacuum.

Preferably, the process steps from the step of depositing the first oxide film to the step of depositing the second oxide film are carried out at a temperature of 600° to 850° C. and a pressure of 1 mTorr to 100 Torr in a continuous manner in a single processing device without losing the vacuum.

As is apparent from the above description, the present invention provides a method for forming an interlayer insulating film, which involves a first oxide film deposition, a GeBPSG film deposition, a thermal treatment and a second oxide film deposition all being carried out in a continuous manner in an LPCVD device. Accordingly, it is possible to form an interlayer insulating film having a superior planarization characteristic in a single pass.

Since the deposition and thermal treatment of the interlayer insulating film are carried out in a continuous manner in a single processing device, it is possible to effectively suppress a degradation of the GeBPSG film caused by a moisture absorption. Since a protective oxide film is deposited over the GeBPSG film in a continuous manner after the thermal treatment of the GeBPSG film, the degradation of the GeBPSG film caused by the moisture absorption can be effectively suppressed.

Moreover, an improvement in film stability is obtained because the deposition of the GeBPSG film is performed at a higher temperature than the deposition temperature of 350° to 400° C. used in the conventional method.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming an interlayer insulating film of a semiconductor device, comprising the steps of:

forming a first oxide film over a substrate having a topology;

forming a Ge boro phospho silicate glass film over the first oxide film, wherein the Ge boro phospho silicate glass film is deposited to a thickness of 1,000 to 10,000 Å under the condition that the content of Ge is 30 wt % or less, the content of B ranges from 1 wt % to 10 wt %, and the content of P ranges from 1 wt % to 10 wt %;

planarizing the Ge boro phospho silicate glass film using a thermal treatment process without losing a vacuum;

forming a second oxide film over the Ge boro phospho silicate glass film, wherein the steps from the step of depositing the first oxide film to the step of depositing the second oxide film are carried out at a temperature of 600° to 850° C. and a pressure of 1 mTorr to 100 Torr in a continuous manner in a single processing device without losing the vacuum.

2. The method in accordance with claim 1, wherein the first and second oxide films are deposited to a thickness of 100 to 2,000 Å using a reacting gas containing tetra ethyl ortho silicate and $O_2$.

* * * * *